(12) United States Patent
Nakada et al.

(10) Patent No.: US 11,545,972 B2
(45) Date of Patent: Jan. 3, 2023

(54) OVERCURRENT PROTECTION CIRCUIT FOR SWITCHING ELEMENT TURNED ON AND OFF BASED ON CONTROL VOLTAGE

(71) Applicant: OMRON Corporation, Kyoto (JP)

(72) Inventors: Hironori Nakada, Nara (JP); Satoshi Iwai, Hirakata (JP); Noriyuki Nosaka, Nara (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/273,101

(22) PCT Filed: Jan. 30, 2020

(86) PCT No.: PCT/JP2020/003398
§ 371 (c)(1),
(2) Date: Mar. 3, 2021

(87) PCT Pub. No.: WO2020/158853
PCT Pub. Date: Aug. 6, 2020

(65) Prior Publication Data
US 2021/0226620 A1    Jul. 22, 2021

(30) Foreign Application Priority Data
Feb. 1, 2019    (JP) .............................. JP2019-017332

(51) Int. Cl.
*H03K 17/082* (2006.01)
(52) U.S. Cl.
CPC ................................ *H03K 17/0826* (2013.01)
(58) Field of Classification Search
CPC ............. H03K 17/0826; H02M 3/156; H02M 7/5387; H02M 1/32; H02M 1/08
See application file for complete search history.

(56) References Cited

U.S. PATENT DOCUMENTS

| 2003/0047751 A1* | 3/2003 | Ishizuka ............. H01L 27/0262 257/173 |
| 2007/0058307 A1* | 3/2007 | Mergens ............. H01L 29/7436 361/56 |
| 2019/0115771 A1* | 4/2019 | Abe ..................... H02J 7/00712 |

FOREIGN PATENT DOCUMENTS

| JP | 2000037073 A | 2/2000 |
| JP | 2006014402 A | 1/2006 |
| WO | WO-2016114416 A1 * | 7/2016 ............. H03K 17/16 |

OTHER PUBLICATIONS

Translation of Lee WO2016114416A1 (Year: 2016).*
(Continued)

*Primary Examiner* — Scott Bauer
(74) *Attorney, Agent, or Firm* — Cantor Colburn LLP

(57) ABSTRACT

An overcurrent protection circuit is provided for a switching element turned on/off based on a control voltage. The overcurrent protection circuit includes a first transistor and a second transistor. The first transistor is a PNP bipolar transistor and has an emitter connected to the control voltage. The second transistor is an NPN bipolar transistor and has a base connected to a collector of the first transistor, a collector connected to a base of the first transistor and pulled up to a predetermined pull-up voltage, and a grounded emitter. When the control voltage exceeds a predetermined first threshold voltage, the first and second transistors are turned on, the control voltage is dropped by drop of the pull-up voltage, and thus the overcurrent protection circuit starts a protection operation of turning off the switching element.

3 Claims, 12 Drawing Sheets

(56) References Cited

OTHER PUBLICATIONS

International Search Report for International Application PCT/JP2020/003398; dated Mar. 17, 2020.
PCT Written Opinion of the International Searching Authority for International Application No. PCT/JP2020/003398; dated Mar. 17, 2020.

* cited by examiner

OVERCURRENT PROTECTION CIRCUIT FOR SWITCHING ELEMENT TURNED ON AND OFF BASED ON CONTROL VOLTAGE

CROSS REFERENCE TO RELATED APPLICATIONS

This is the U.S. national stage application No. PCT/JP2020/003398, filed on Jan. 30, 2020, Priority under 35 U.S.C. § 119(a) and 35 U.S.C. § 365(b) is claimed from Japanese Application No. 2019-017332, filed Feb. 1, 2019, the disclosure of which is also incorporated herein by reference.

TECHNICAL FIELD

The present invention relates to an overcurrent protection circuit and a switching circuit. Here, the switching circuit is, for example, a switching circuit such as a boost chopper circuit, a half-bridge inverter circuit, a full-bridge inverter circuit, or the like.

BACKGROUND ART

Semiconductor devices generally have short-circuit capacity, and there is a risk of breakdown when a current exceeding the short-circuit capacity flows. Overcurrent protection of the semiconductor device can be performed by detecting at a high speed the flow of the overcurrent to the semiconductor device due to the short circuit, and stopping the current flowing to the semiconductor device.

For example, Patent Document 1 provides an overcurrent protector of a power converter in which the set level of collector short circuit detected voltage is altered at an arbitrary timing even when the DC voltage is high, low or constant, and a voltage driven element is protected surely against overcurrent.

The overcurrent protector of a power converter according to Patent Document 1 includes: a power converter having a voltage driven power switching element; overcurrent detecting sections for detecting the voltage at the input side main terminal of the power switching element and providing an off signal to the power switching element when that voltage exceeds a predetermined level; and overcurrent setting sections being connected in parallel with the overcurrent detecting section at an arbitrary timing to alter the predetermined level.

A GaN device is a semiconductor device using gallium nitride GaN and has a characteristic of being capable of being driven at a higher frequency compared with a conventional semiconductor device such as an insulated gate bipolar transistor (IGBT) and an SiC device.

PRIOR ART DOCUMENT

Patent Document

Patent Document 1: JP 2006-14402 A

SUMMARY OF THE INVENTION

Problems to be Solved by the Invention

However, a GaN device is more vulnerable to overcurrent compared with a conventional semiconductor device, and sometimes breaks down overcurrent of about 100 nanoseconds, for example. Therefore, conventional overcurrent protection techniques such as DESAT, CT detection, or the technique of Patent Document 1 cannot adequately protect GaN devices.

An object of the present invention is to provide a switching circuit and an overcurrent protection circuit that are capable of solving the above problem and protecting a semiconductor switch from overcurrent at a high speed as compared with the conventional technique.

Means for Solving the Problems

According to the first invention, there is provided an overcurrent protection circuit for a switching element turned on/off based on a control voltage. The overcurrent protection circuit includes a first transistor and a second transistor. The first transistor is a PNP bipolar transistor and has an emitter connected to the control voltage. The second transistor is an NPN bipolar transistor and has a base connected to a collector of the first transistor, a collector connected to a base of the first transistor and pulled up to a predetermined pull-up voltage, and a grounded emitter. When the control voltage exceeds a predetermined first threshold voltage, the first and second transistors are turned on, the control voltage is dropped by drop of the pull-up voltage, and thus the overcurrent protection circuit starts a protection operation of turning off the switching element.

The overcurrent protection circuit further comprises a first capacitor that is a capacitor connected to a collector and emitter of the second transistor, the first capacitor reducing a change in the pull-up voltage when the control voltage rises.

Also, the overcurrent protection circuit further comprises a time constant circuit connected in parallel to a collector and emitter of the second transistor, the time constant circuit including a resistor and a second capacitor, and adjusting a time interval from start to end of the protection operation by changing a time constant.

Further, the overcurrent protection circuit further comprises a diode connected in parallel to the resistor.

The overcurrent protection circuit further comprises:
a control unit that generates the control voltage; and
a voltage detector unit that detects the pull-up voltage, and outputs the detected voltage having been detected to the control unit as a first control signal for turning off the switching element.

Also, the overcurrent protection circuit further comprises another switching element that turns the pull-up voltage from off to on, based on a second control signal from the control unit when the overcurrent protection circuit returns from the protection operation.

According to the second invention, there is provided a switching circuit including the overcurrent protection circuit described above and the switching element.

Effects of the Invention

According to the present invention, it is possible to protect a semiconductor device from overcurrent at a high speed as compared with the conventional technique.

MODES FOR CARRYING OUT THE INVENTION

Embodiments according to the present invention will be described below with reference to the drawings. However, each of the embodiments described below is merely an example of the present invention in all respects. Needless to say, various improvements and variations can be made without departing from the scope of the present invention. That is, in carrying out the present invention, a specific configuration according to the embodiment may be employed as appropriate.

First Embodiment

Figure 1:
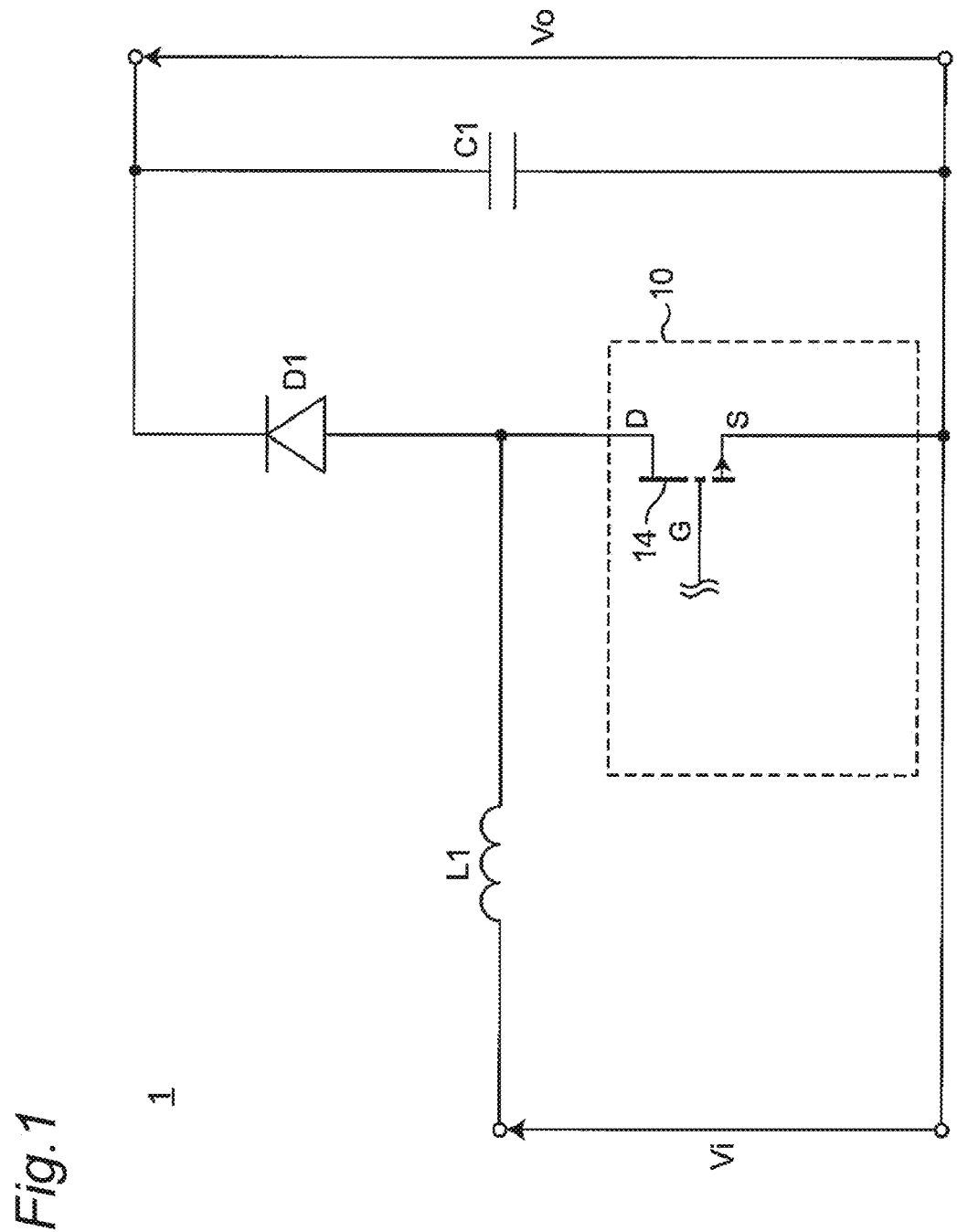
FIG. 1 is a block diagram showing a configuration example of a boost chopper circuit 1 according to a first embodiment.

FIG. 1 is a block diagram showing a configuration example of the boost chopper circuit 1 according to the first embodiment. In FIG. 1, the boost chopper circuit 1 includes the current-driven switching circuit 10 having a semiconductor switch 14 that is a switching element, an inductor L1, a diode D1, and a capacitor C1.

In FIG. 1, an input voltage Vi is applied via the inductor L1 to the connection point between the anode of the diode D1 and the drain of the semiconductor switch 14. The source of the semiconductor switch 14 is grounded. The cathode of the diode D1 is connected to one end of the capacitor C1 that outputs an output voltage Vo, and the other end thereof is grounded.

In the boost chopper circuit 1 configured as described above, the inductor L1 generates an electromotive force in a direction that hinders a change in current. Therefore, when the semiconductor switch 14 is switched from on to off, the inductor L1 generates an electromotive force in the same direction as the input voltage Vi so as to hinder the current from dropping due to the resistor of the diode D1. Thus, a voltage higher than the input voltage Vi is generated, and the voltage is smoothed by the capacitor C1 and converted into the output voltage Vo. Therefore, by periodically and selectively switching on/off of the semiconductor switch 14, the boost chopper circuit 1 converts the input voltage Vi to the direct-current output voltage Vo higher in voltage than the input voltage Vi, and outputs the direct-current output voltage Vo.

Figure 2:
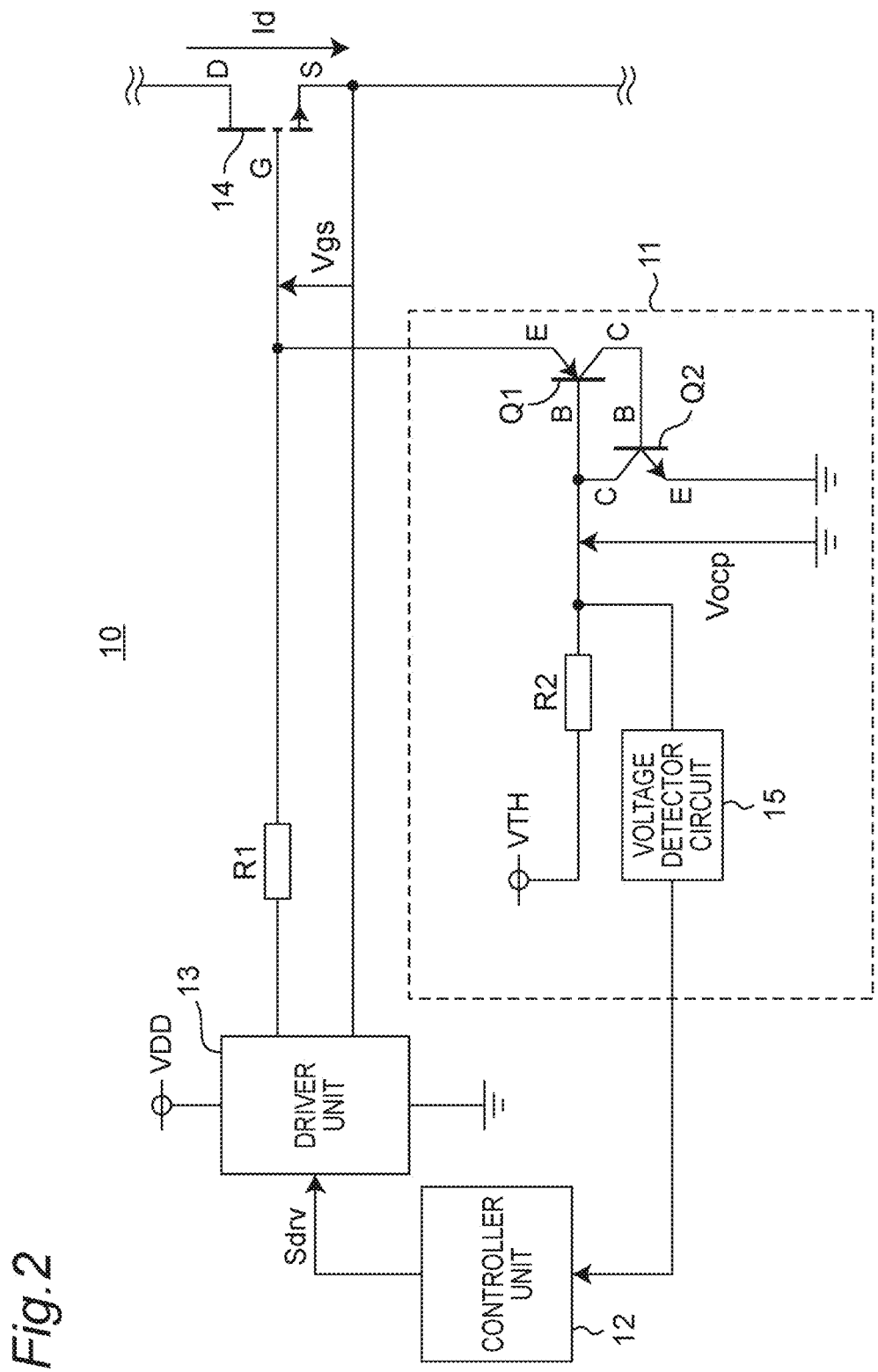
FIG. 2 is a block diagram showing a detailed configuration example of a current-driven switching circuit 10 of FIG. 1.

FIG. 2 is a block diagram showing a detailed configuration example of the current-driven switching circuit 10 of FIG. 1. In FIG. 2, the current-driven switching circuit 10 includes an overcurrent protection circuit 11, a control unit 12, a driver unit 13, the semiconductor switch 14, and a resistor R1. The overcurrent protection circuit 11 includes transistors Q1 and Q2, a pull-up resistor R2, and a voltage detector circuit 15.

In FIG. 2, the control unit 12 controls the driver unit 13 by a drive signal Sdrv, which is a pulse signal. The control unit 12 monitors a signal indicating a detected voltage Vocp input from the voltage detector circuit 15 of the overcurrent protection circuit 11, and when the detected voltage Vocp becomes less than a predetermined threshold value, the control unit 12 sets an abnormality detection flag Fh to a high level, fixes the drive signal Sdrv to a low level, and stops the driver unit 13.

The driver unit 13 applies a gate-source voltage Vgs to the gate of the semiconductor switch 14 via the resistor R1 based on the drive signal Sdrv from the control unit 12 to control the semiconductor switch 14 to be turned on/off. The semiconductor switch 14 is a switching element such as a GaN device, for example, and is turned on/off by the driver unit 13 to selectively switch whether or not to conduct a drain current Id. The gate-source voltage Vgs is an example of the "control voltage" of the present invention.

In the overcurrent protection circuit 11, the transistor Q1 is, for example, a PNP bipolar transistor. The transistor Q2 is, for example, an NPN bipolar transistor, and has a base connected to the collector of the transistor Q1, a collector connected to the base of the transistor Q1, and a grounded emitter. The collector of the transistor Q2 is pulled up to a threshold voltage VTH via the pull-up resistor R2. The threshold voltage VTH is an example of the "pull-up voltage" of the present invention.

Here, while the transistor Q1 is turned off (insulated), no current flows through the base of the transistor Q2. When the transistor Q1 is turned on, the emitter and the collector conduct, and hence current flows between the base and the emitter of the transistor Q2. Therefore, when the transistor Q1 is turned on, the transistor Q2 is also turned on. The voltage detector circuit 15 detects the detected voltage Vocp, which is the collector-emitter voltage of the transistor Q2, and outputs a signal indicating the detected voltage Vocp to the control unit 12. The voltage detector circuit 15 is an example of the "voltage detector unit" of the present invention, and the signal indicating the detected voltage Vocp is an example of the "first control signal" of the present invention.

Figure 3:
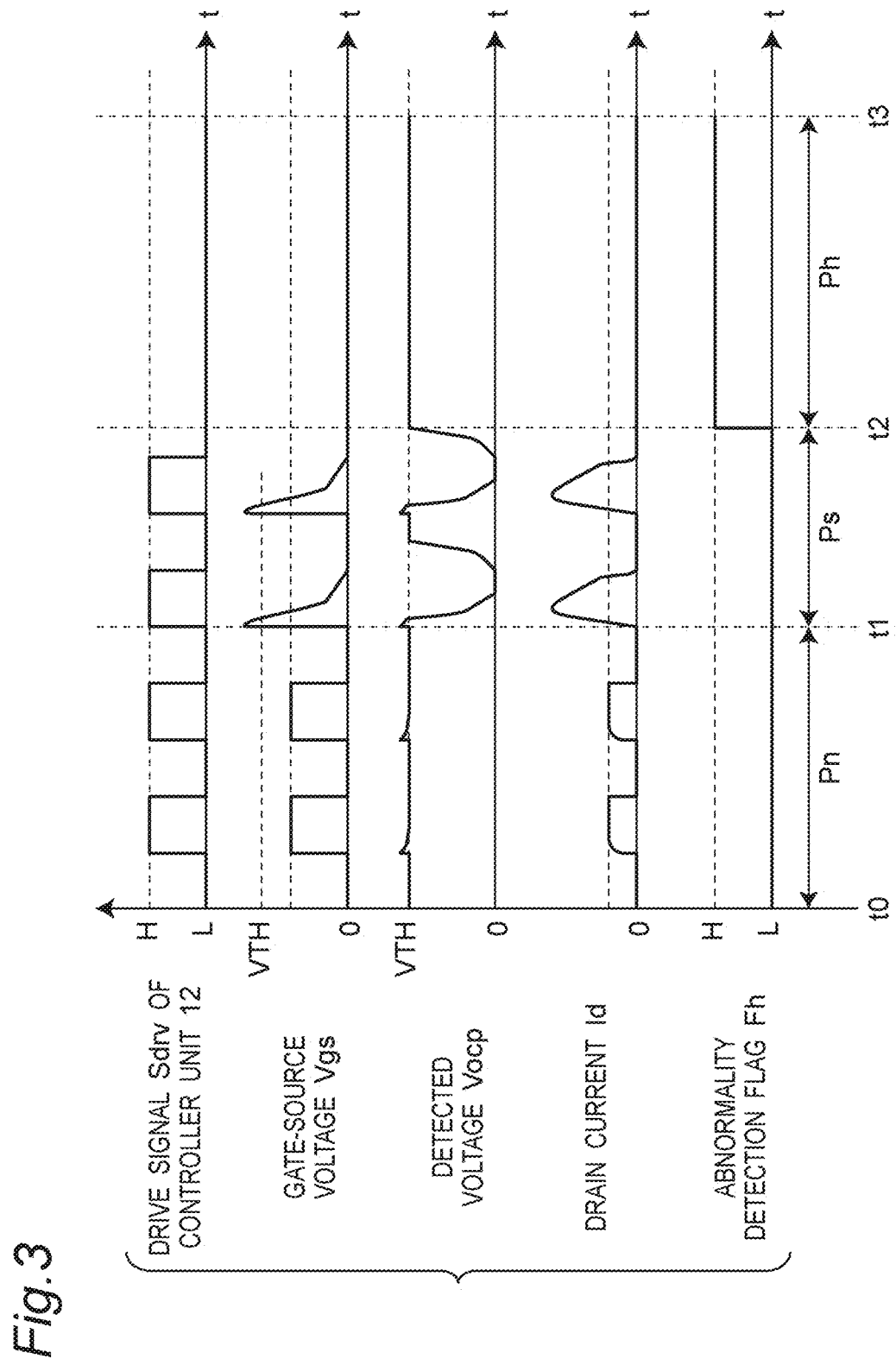
FIG. 3 is a timing chart showing operation waveforms of signals and the like in the current-driven switching circuit 10 of FIG. 1.

FIG. 3 is a timing chart showing operation waveforms of signals and the like in the current-driven switching circuit 10 of FIG. 1.

In FIG. 3, the current-driven switching circuit 10 starts operation at time t0, and a short circuit occurs in the semiconductor switch 14 at time t1, and then the control unit 12 detects the short circuit at time t2. Here, the time interval from time t0 to t1 is referred to as a stationary time interval Pn, the time interval from time t1 to t2 is referred to as a short-circuit time interval Ps, and the time interval after time t2 is referred to as a stop time interval Ph.

In the stationary time interval Pn, no current flows through the pull-up resistor R2 except the time interval in which the detected voltage Vocp overshoots (described later in details), and hence the detected voltage Vocp is the threshold voltage VTH. Since this threshold voltage VTH has been set higher than the gate-source voltage Vgs supplied by the driver unit 13 when the drive signal Sdrv is at a high level, both the transistors Q1 and Q2 are always turned off in the stationary time interval Pn.

In general, when an overcurrent flows through a semiconductor device, a gate-source voltage of a semiconductor switch included in the semiconductor device overshoots (momentary rises). Also in the present embodiment, at time t1 in FIG. 3, the drain current Id flowing through the semiconductor switch 14 rises excessively, and the gate-source voltage Vgs of the semiconductor switch 14 rises rapidly to a value higher than the threshold voltage VTH. Thus, the transistor Q1 is turned on, and therefore the transistor Q2 is also turned on.

When both the transistors Q1 and Q2 are turned on, the gate of the semiconductor switch 14 is grounded through the transistors Q1 and Q2. Therefore, the gate-source voltage Vgs rapidly drops to 0. Since this turns the semiconductor switch 14 off, the overcurrent flowing through the semiconductor switch 14 is stopped, and the overcurrent protection circuit 11 can start the protection operation. The time interval from when the short circuit occurs at time t1 to when the overcurrent protection circuit 11 starts the protection operation includes a delay in the switching of the transistors Q1 and Q2, and is as short as, for example, 20 to 100 nanoseconds.

When the transistor Q2 is on, the detected voltage Vocp rapidly drops to 0. When the resistor R1 is smaller than the pull-up resistor R2, the gate-source voltage Vgs drops faster than the detected voltage Vocp. Therefore, the transistor Q1 can be kept on even if the gate-source voltage Vgs drops. Thereafter, when the drive signal Sdrv of the control unit becomes a low level, the driver unit 13 is stopped, and the gate-source voltage Vgs drops to 0. Therefore, since the transistors Q1 and Q2 are sequentially turned off, the detected voltage Vocp rises again to the threshold voltage VTH, and the protection operation ends.

The voltage detector circuit 15 outputs a signal indicating the detected voltage Vocp to the control unit 12. The control unit 12 monitors the value of the detected voltage Vocp, and when the detected voltage Vocp falls below a predetermined threshold value, the control unit 12 determines that the protection operation has been performed, sets the abnormality detection flag Fh to a high level, and stops the output of the drive signal Sdrv (at time t2). In the stop time interval Ph, the drive signal Sdrv is always at a low level, and the semiconductor switch 14 always remains off.

If the response of the control unit 12 is slow, the drive signal Sdrv can become a high level again before the output of the drive signal Sdrv stops at time t2. In that case, as shown in FIG. 3, the overcurrent flows through the semiconductor switch 14 again, and the overcurrent protection circuit 11 starts the protection operation again.

As described above, the overcurrent protection circuit 11 according to the present embodiment includes the pull-up resistor R2, the PNP transistor Q1, the NPN transistor Q2, and the voltage detector circuit 15. When the gate-source voltage Vgs of the semiconductor switch 14 exceeds the threshold voltage VTH, the transistors Q1 and Q2 are sequentially turned on. Thus, the overcurrent protection circuit 11 reduces the gate-source voltage Vgs to 0 and starts the protection operation of turning off the semiconductor switch. The control unit 12 monitors the detected voltage Vocp detected by the voltage detector circuit 15, and when the detected voltage Vocp falls below a predetermined threshold voltage, the control unit 12 stops the driver unit 13 to turn off the semiconductor switch 14. Therefore, according to the present embodiment, the overcurrent flowing through the semiconductor switch 14 can be stopped at a high speed as compared with the conventional technique, and the semiconductor switch 14 can be protected.

Second Embodiment

In the first embodiment, when the gate-source voltage Vgs of the semiconductor switch 14 rises, the detected voltage Vocp overshoots as shown in FIG. 3. This delays the drop of the detected voltage Vocp, thereby delaying the start of the protection operation. As described above, when the response speed of the control unit 12 is slow after the overcurrent protection in the short-circuit time interval Ps, the overcurrent repeatedly flows through the semiconductor switch 14, which is not desirable.

Figure 4:
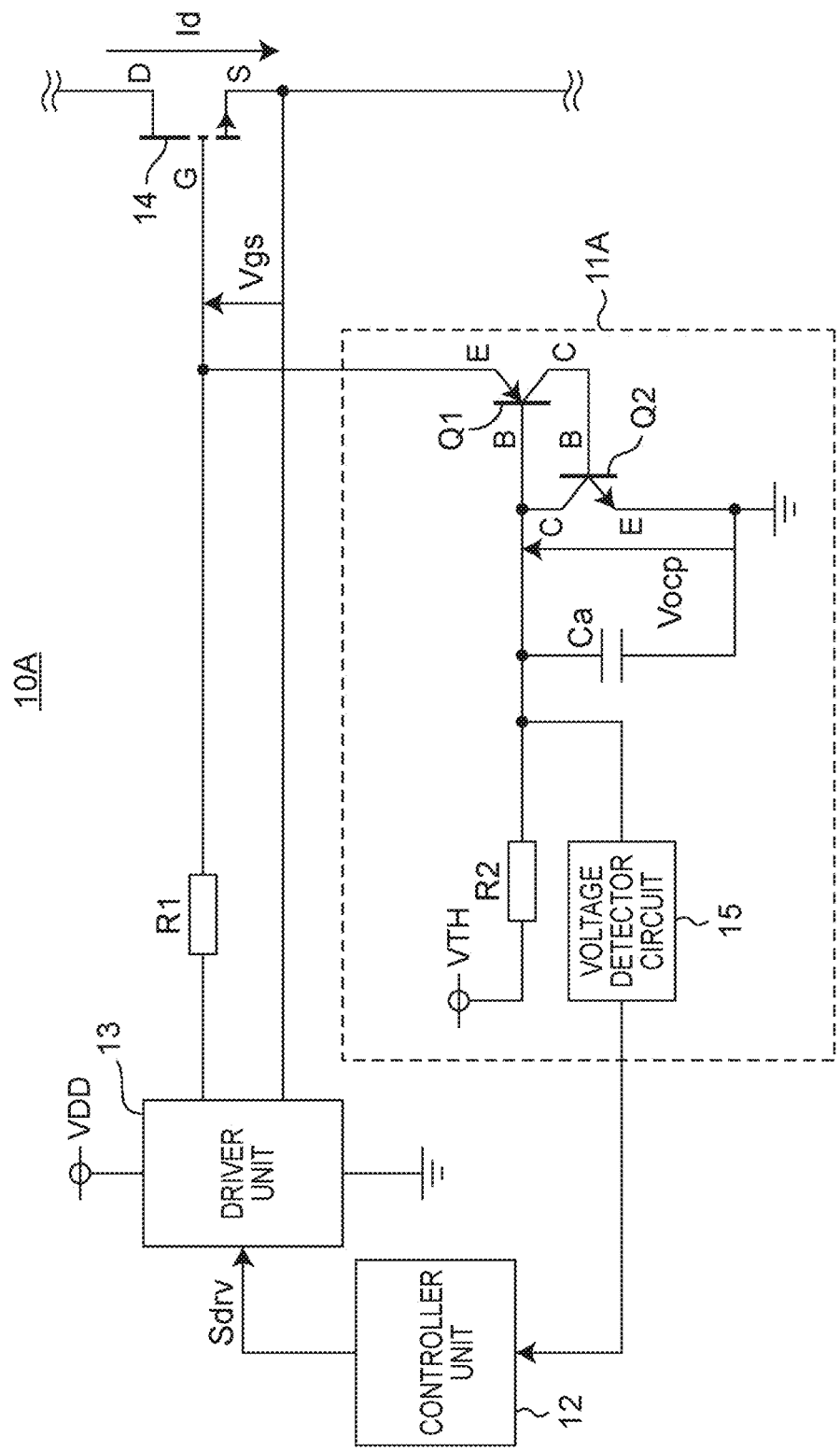
FIG. 4 is a block diagram showing a configuration example of a current-driven switching circuit 10A according to a second embodiment.

FIG. 4 is a block diagram showing a configuration example of the current-driven switching circuit 10A according to the second embodiment. In FIG. 4, the current-driven switching circuit 10A is different from the current-driven switching circuit 10 in the following respects.

(1) An overcurrent protection circuit 11A further includes a capacitor Ca connected to the collector and emitter of the transistor Q2.

(2) The power supply of the threshold voltage VTH charges the capacitor Ca to the threshold voltage VTH via the pull-up resistor R2.

Figure 5:
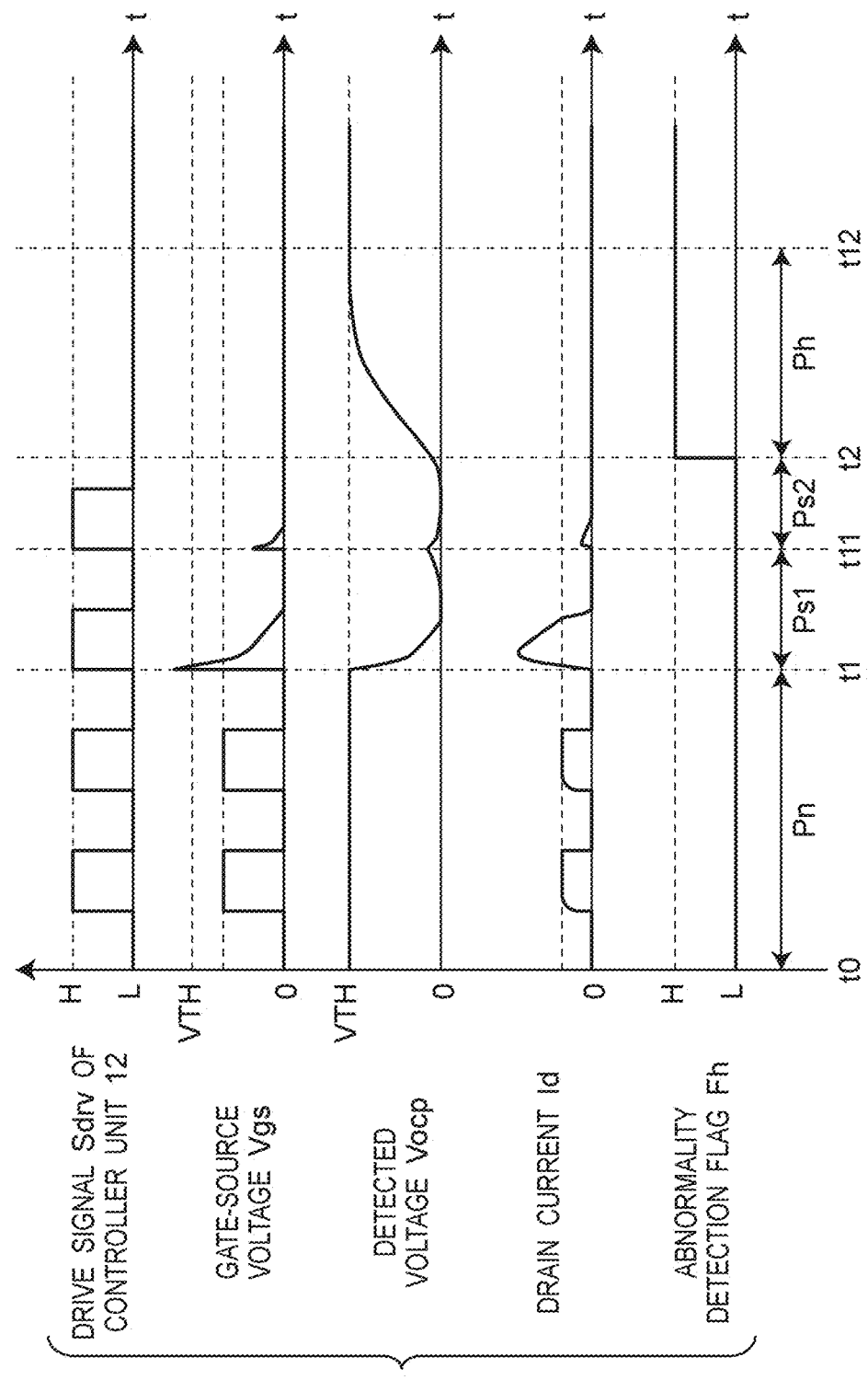
FIG. 5 is a timing chart showing operation waveforms of signals and the like in the current-driven switching circuit 10A of FIG. 4.

FIG. 5 is a timing chart showing operation waveforms of signals and the like in the current-driven switching circuit 10A of FIG. 4. Time t11 indicates a timing at which the drive signal Sdrv rises again in the short-circuit time interval Ps of FIG. 3.

In FIG. 5, a short circuit occurs in the semiconductor switch 14 at time t1, and the gate-source voltage Vgs rises rapidly. At this time, the detected voltage Vocp overshoots due to the rise of the gate-source voltage Vgs, but this change is reduced by the capacitor Ca. Therefore, it is possible to suppress the delay of the start of the protection operation.

When the transistors Q1 and Q2 are turned on in the short-circuit time interval Ps1, the capacitor Ca is grounded via the transistor Q2, and the capacitor Ca is discharged to a zero potential. Thereafter, the drive signal Sdrv becomes a low level, the transistors Q1 and Q2 are turned off, and the detected voltage Vocp starts rising. Here, the threshold voltage VTH charges the capacitor Ca. Therefore, the time interval required for the detected voltage Vocp to rise to the threshold voltage VTH becomes longer than the time interval in the first embodiment. By appropriately selecting the capacitor Ca, the time interval required for the detected voltage Vocp to rise to the threshold voltage VTH can be made longer than the time interval required for the drive signal Sdrv to become a high level again (at time t11). Thus, even if the control signal becomes the high level again, the transistors Q1 and Q2 are turned on before the gate-source voltage Vgs reaches the threshold voltage VTH, and the semiconductor switch 14 is protected.

As described above, the overcurrent protection circuit 11A according to the present embodiment further includes the capacitor Ca in addition to the overcurrent protection circuit 11. Thus, the time interval from when the overcurrent protection circuit 11A performs the protection operation to when restoring from the protection operation can be made longer than that of the overcurrent protection circuit 11 shown in FIG. 2, and it is possible to prevent the phenomenon that the overcurrent repeatedly flows through the semiconductor switch 14. The overshoot of the detected voltage Vocp due to the rise of the gate-source voltage Vgs can be made smaller than that of the overcurrent protection circuit 11 shown in FIG. 2, and the delay in the start of the protection operation can be made smaller than that of the overcurrent protection circuit 11.

Third Embodiment

Figure 6:
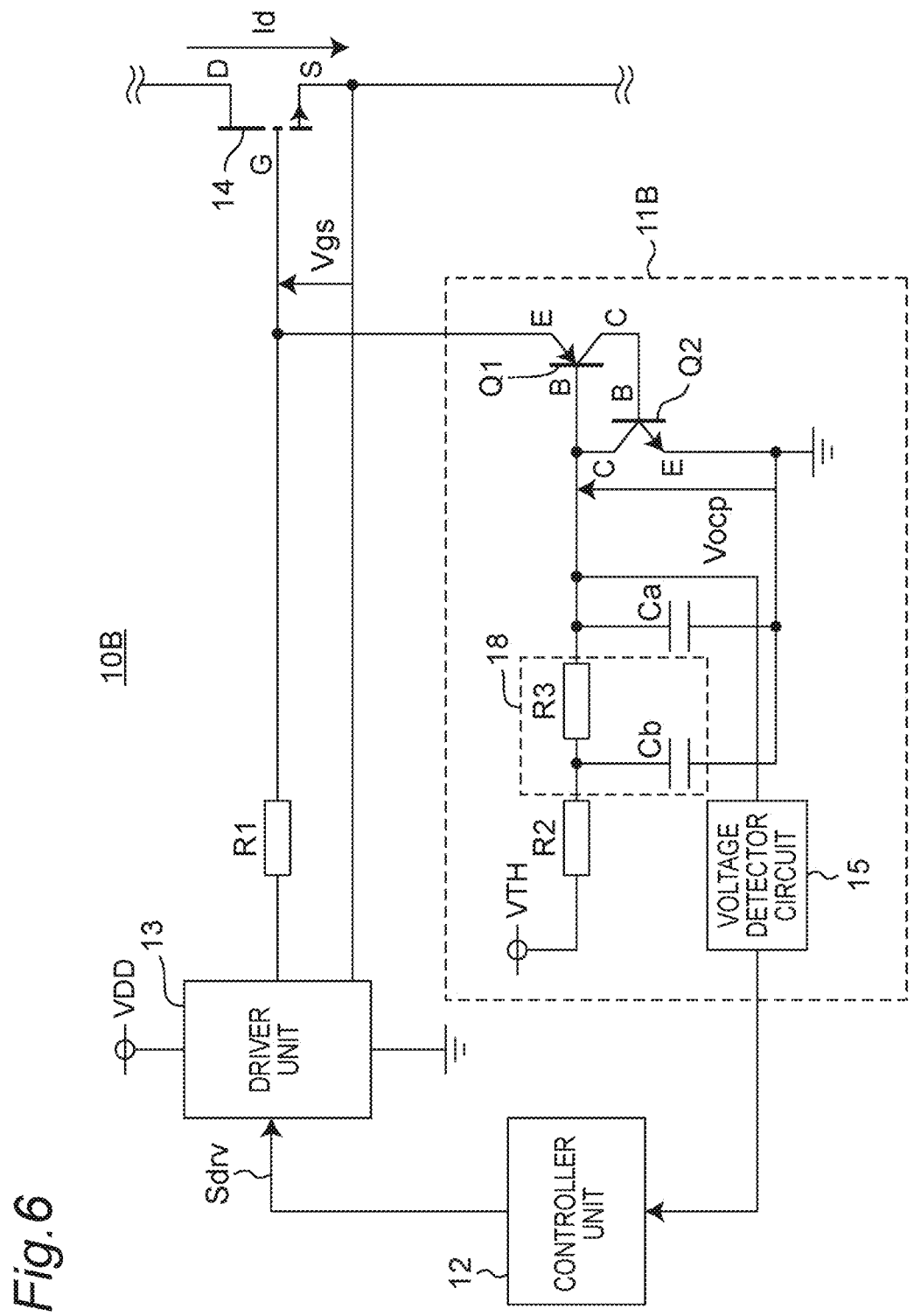
FIG. 6 is a block diagram showing a configuration example of a current-driven switching circuit 10B according to a third embodiment.

FIG. 6 is a block diagram showing a configuration example of the current-driven switching circuit 10B according to the third embodiment.

In FIG. 6, the current-driven switching circuit 10B is different from the current-driven switching circuit 10A in the following respects.

(1) The current-driven switching circuit 10B further includes a time constant circuit 18 including a resistor R3 and a capacitor Cb.

(2) The time constant circuit 18 is connected in parallel to the collector and emitter of the transistor Q2.

Thus, the time constant at which the capacitor Ca discharged to the zero potential is charged to the threshold voltage VTH is adjusted, and the time interval for an overcurrent protection circuit 11B to return from the protection operation becomes longer than that of the overcurrent protection circuit 11A. With the time constant circuit 18 inserted into the current-driven switching circuit 10 of the first embodiment, the same effect can also be achieved.

As described above, the current-driven switching circuit 10B according to the third embodiment further includes the time constant circuit 18 including the resistor R3 and the capacitor Cb. The time interval for the overcurrent protection circuit 11B to return from the protection operation is adjusted by appropriately selecting the resistor R3 and the capacitor Cb.

Fourth Embodiment

Figure 7:
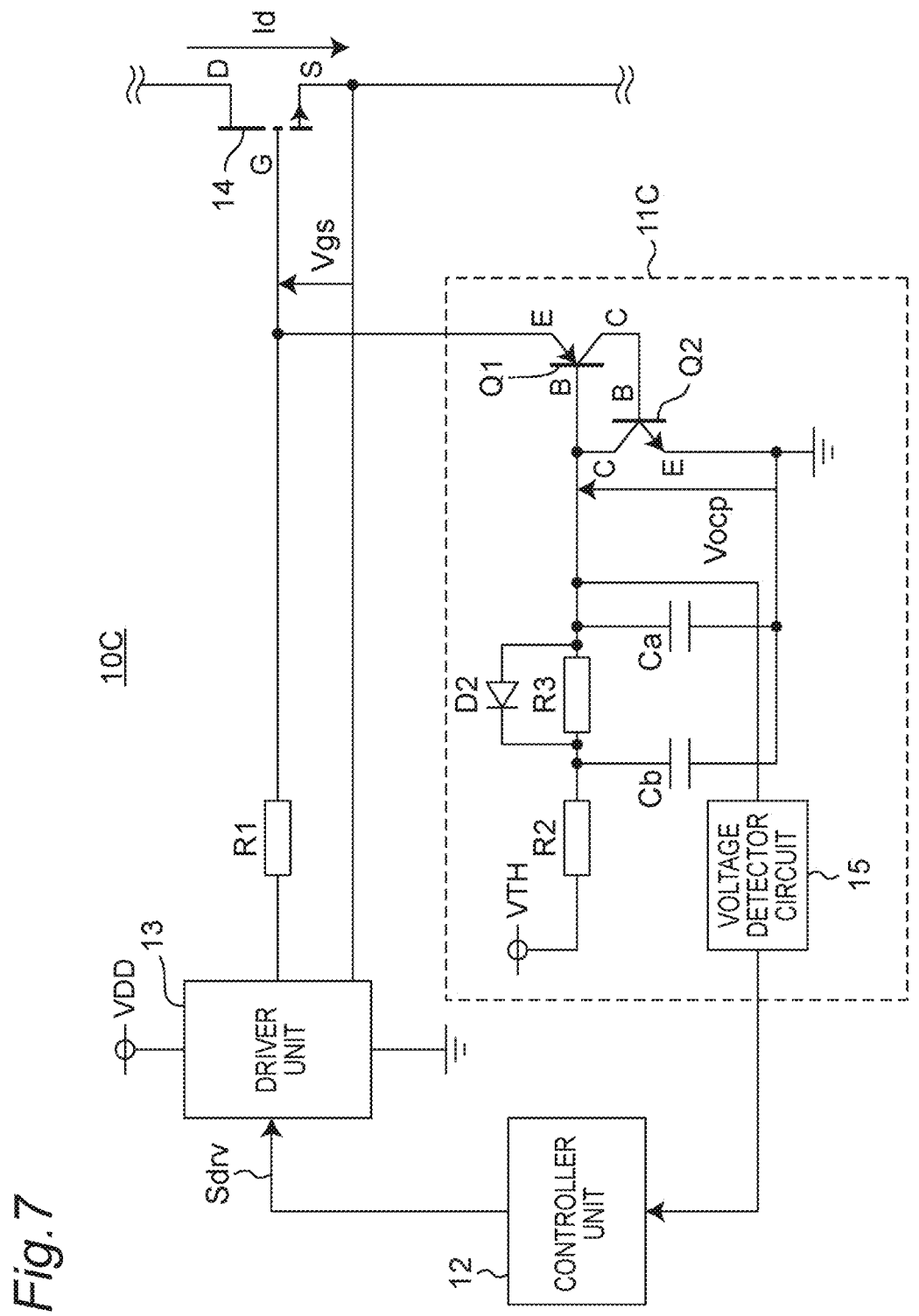
FIG. 7 is a block diagram showing a configuration example of a current-driven switching circuit 10C according to a fourth embodiment.

FIG. 7 is a block diagram showing a configuration example of the current-driven switching circuit 10C according to the fourth embodiment. In FIG. 7, the current-driven switching circuit 10C is different from the current-driven switching circuit 10B of FIG. 6 in the following respects.

(1) An overcurrent protection circuit 11C further includes a diode D2 having an anode connected to one end of the resistor R3 on the low potential side and a cathode connected to the other end of the resistor R3.

As described above, the current-driven switching circuit 10C according to the fourth embodiment further includes the diode D2. The influence of noise in the gate-source voltage Vgs or the like on the overcurrent protection circuit 11C is suppressed more than that of the overcurrent protection circuit 11B.

Fifth Embodiment

Figure 8:
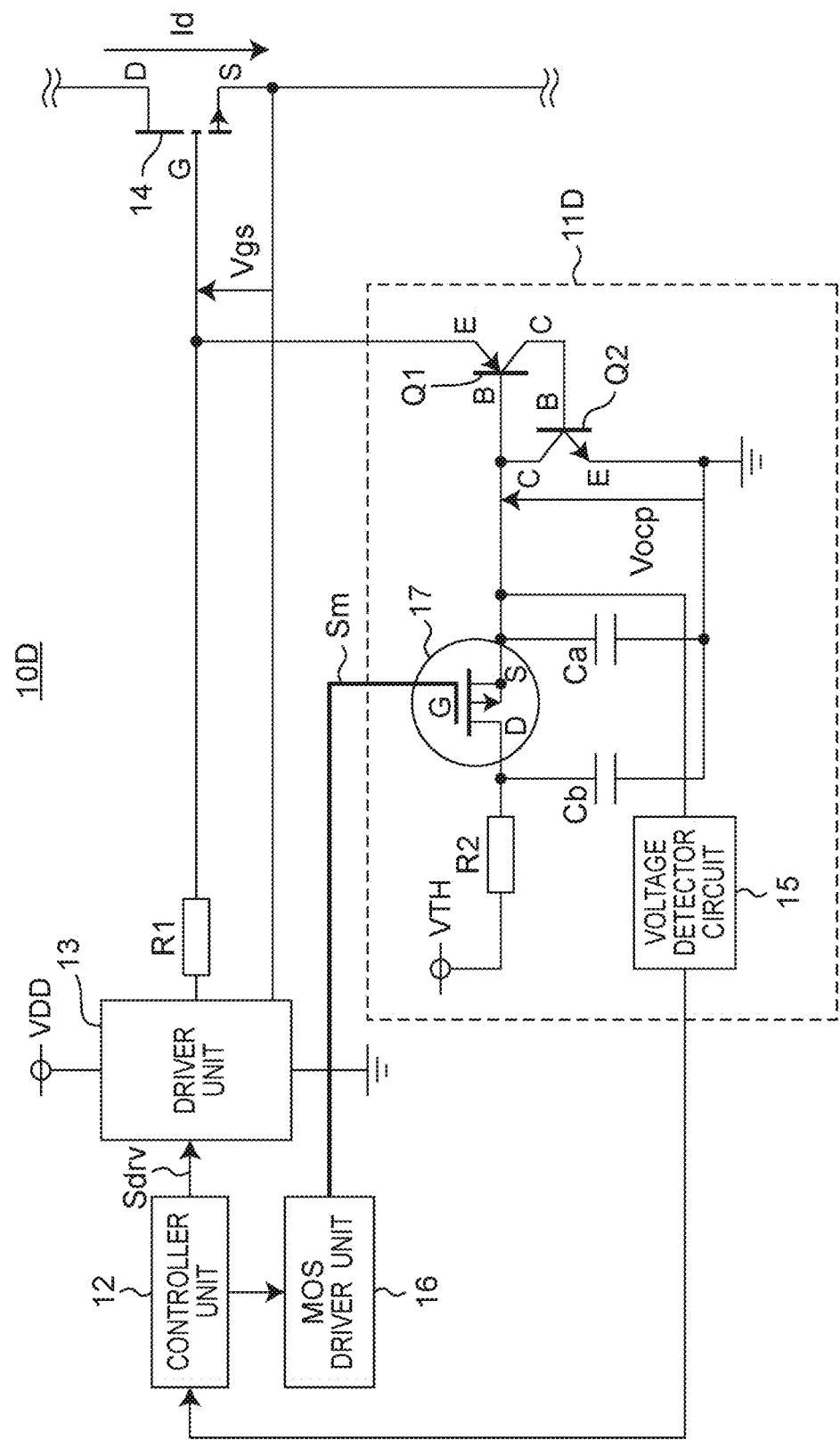
FIG. 8 is a block diagram showing a configuration example of a current-driven switching circuit 10D according to a fifth embodiment.

FIG. 8 is a block diagram showing a configuration example of the current-driven switching circuit 10D according to the fifth embodiment.

In FIG. 8, the current-driven switching circuit 10D is different from the current-driven switching circuit 10B of FIG. 6 in the following respects.

(1) The current-driven switching circuit 10D further includes a MOS driver unit 16.

(2) The resistor R3 is replaced with a MOSFET 17.

In FIG. 8, the MOS driver unit 16 is controlled by the control unit 12, and outputs a MOS drive signal Sm to control the MOSFET 17 to be turned on/off. The MOSFET 17 is controlled by the MOS drive signal Sm, and blocks (turns off) the threshold voltage VTH in a time interval where the MOS drive signal Sm has a low level.

Figure 9:
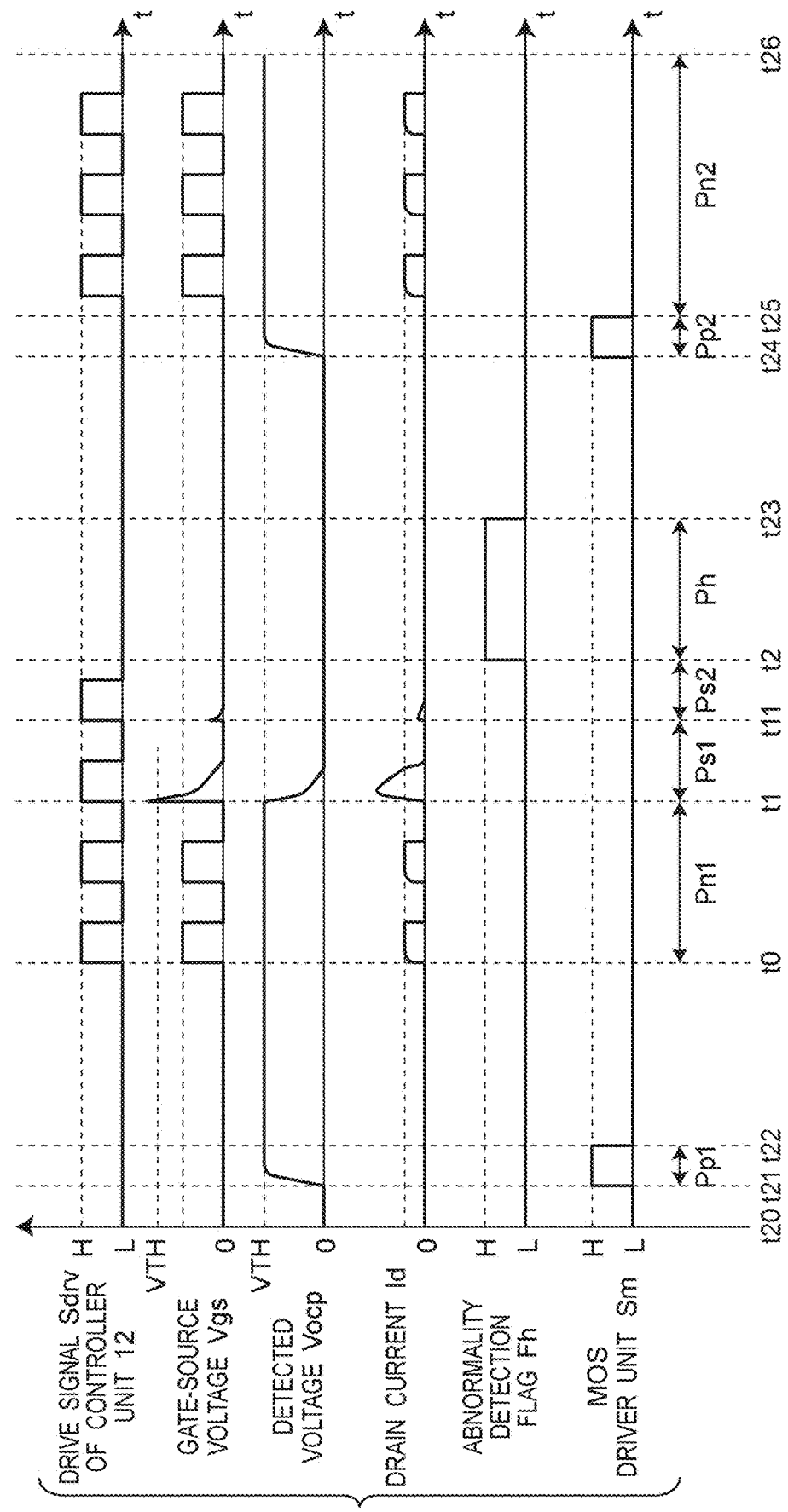
FIG. 9 is a timing chart showing operation waveforms of signals and the like in the current-driven switching circuit 10D of FIG. 8.

FIG. 9 is a timing chart showing an example of operation waveforms of signals and the like in the current-driven switching circuit 10D of FIG. 8.

In FIG. 9, the current-driven switching circuit 10D has a preparation time interval Pp1 (from time t21 to t22) before the start of the operation (at time t0). At time t21, the control unit 12 turns on the MOSFET 17 via the MOS driver unit 16. After the capacitor Ca is charged to the threshold voltage VTH, the control unit 12 turns the MOSFET 17 off via the MOS driver unit 16 (at time t22).

Thereafter, after the normal operation in the stationary time interval Pn1 from time t0 to t1, the protection is started in the short-circuit time interval Ps1, and the capacitor Ca is discharged to the zero potential. In the first to fourth embodiments, after this, the drive signal Sdrv became a low level, the transistors Q1 and Q2 turned off, and the capacitor Ca is charged again. However, in the present embodiment, since the MOSFET 17 has been turned off, the capacitor Ca is not charged, and an overcurrent protection circuit 11D retains the protection operation. Thereafter, when the detected voltage Vocp falls below a predetermined threshold voltage, the control unit 12 sets the abnormality detection flag Fh to a high level and stops the output of the drive signal Sdrv (at time t2).

The time interval from time t2 to t23 is the stop time interval Ph. In the stop time interval Ph, the user of the boost chopper circuit 1 can repair the short-circuited portion to eliminate the short circuit. Thereafter, for example, if a higher-order control circuit detects the resolution of the short circuit and controls the control unit 12, or if the user directly manipulates the control unit 12, the abnormality detection flag Fh of the control unit 12 becomes a low level (at time t23). The control unit 12 detects that the abnormality detection flag Fh has become a low level, and turns on the MOSFET 17 in order to charge the capacitor Ca again (at time t24). Time t24 to t25 is a second preparation time interval Pp2. In a manner similar to that of the preparation time interval Pp1, the MOS drive signal Sm has a high level in the preparation time interval Pp2, and the capacitor Ca is charged up to the threshold voltage VTH.

Due to sufficient charge of the capacitor Ca in the preparation time interval Pp2, the overcurrent protection circuit 11D returns from the protection operation. Thereafter, the current-driven switching circuit 10B resumes a normal operation in a stationary time interval Pn2 similar to that in the stationary time interval Pn1 (at time t25).

As described above, the current-driven switching circuit 10D according to the fifth embodiment includes the MOS driver unit 16 and the MOSFET 17. The MOSFET 17 is controlled by the control unit 12 via the MOS driver unit 16 to control the threshold voltage VTH to be turned on/off. Since the detected voltage Vocp does not rise in a time interval when the MOSFET 17 is off, restoration from the protection operation can be varied out at any timing regardless of delay of the response of the control unit 12 or the like.

In the case where the MOSFET 17 includes a parasitic diode, the effect of suppressing noise can be achieved similarly to the current-driven switching circuit 10C according to the fourth embodiment. The MOSFET 17 according to the present embodiment can be similarly inserted into any of the current-driven switching circuits 10 and 10A to 10C of the first to fourth embodiments, and the same effect can be achieved. The MOSFET 17 according to the present embodiment is an example of "another switching element" of the present invention.

Sixth Embodiment

Figure 10:
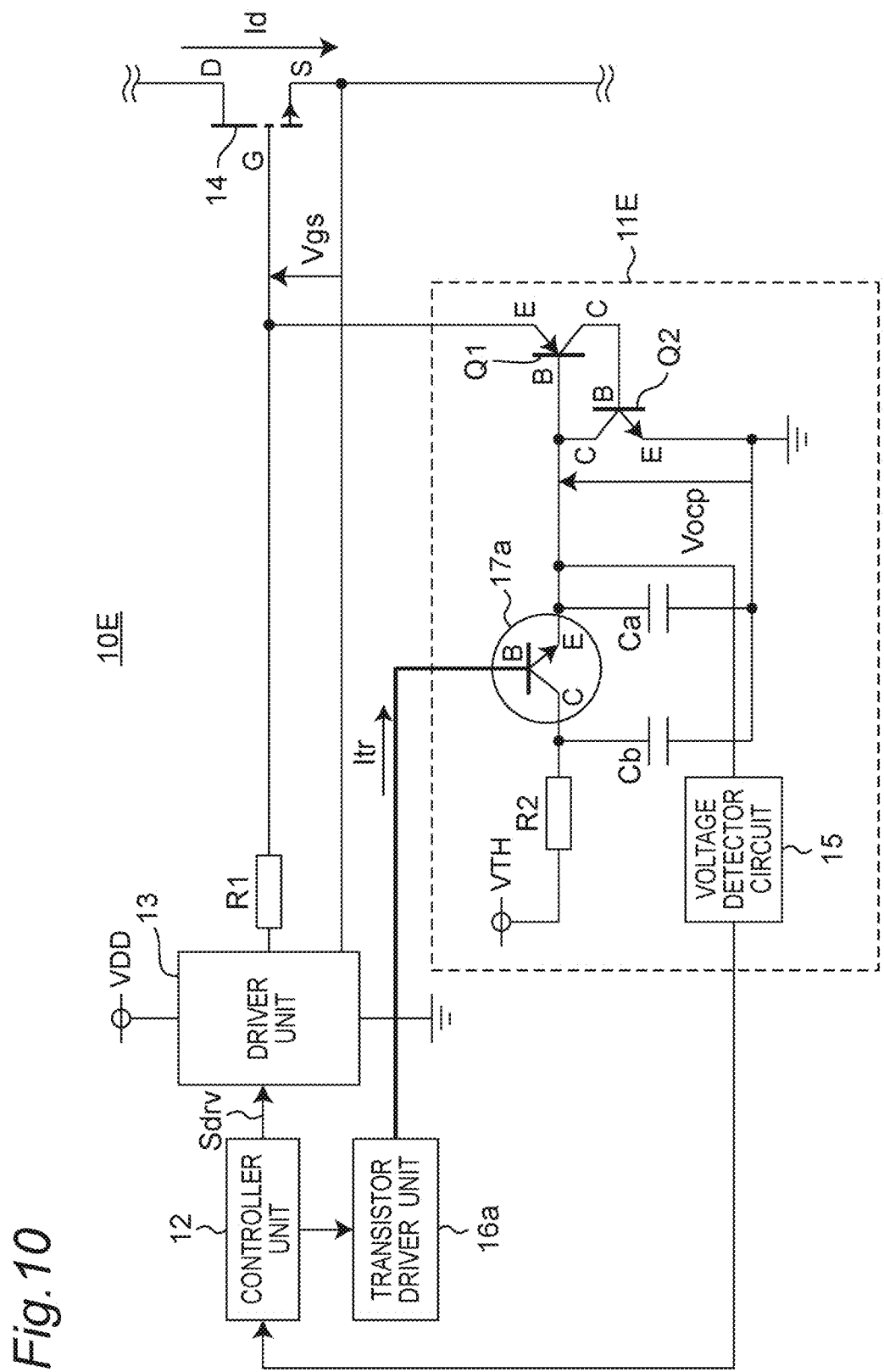
FIG. 10 is a block diagram showing a configuration example of a current-driven switching circuit 10E according to a sixth embodiment.

FIG. 10 is a block diagram showing a configuration example of the current-driven switching circuit 10E according to the sixth embodiment. In FIG. 10, the current-driven switching circuit 10E is different from the current-driven switching circuit 10D of FIG. 8 in the following respects.

(1) A transistor 17a is provided instead of the MOSFET 17.

(2) A transistor driver unit 16a is provided instead of the MOS driver unit 16.

The control unit 12 controls the transistor 17a to be turned on/off by controlling a base current Itr of the transistor 17a via the transistor driver unit 16a. Thus, the same effect as that in the fifth embodiment can be achieved. The transistor 17a in the present embodiment is an example of "another switching element" of the present invention.

Modified Embodiments

While the embodiments of the present invention have been described in detail above, the above-described description is merely an example of the present invention in all respects. Needless to say, various improvements and variations can be made without departing from the scope of the present invention. For example, the changes as follows can be made. In the following description, the same reference numerals are used for the same components as those of the above embodiment, and the description of the same regards as those of the above embodiment is omitted as appropriate. The following variations can be combined as appropriate.

In the first to third embodiments, the boost chopper circuit 1 has been described as a semiconductor device including the current-driven switching circuits 10 and 10A to 10E according to the present invention. However, the present invention is not limited to this, and can be used in a circuit, a device, and the like that controls the switching of current by a semiconductor switch.

Figure 11:
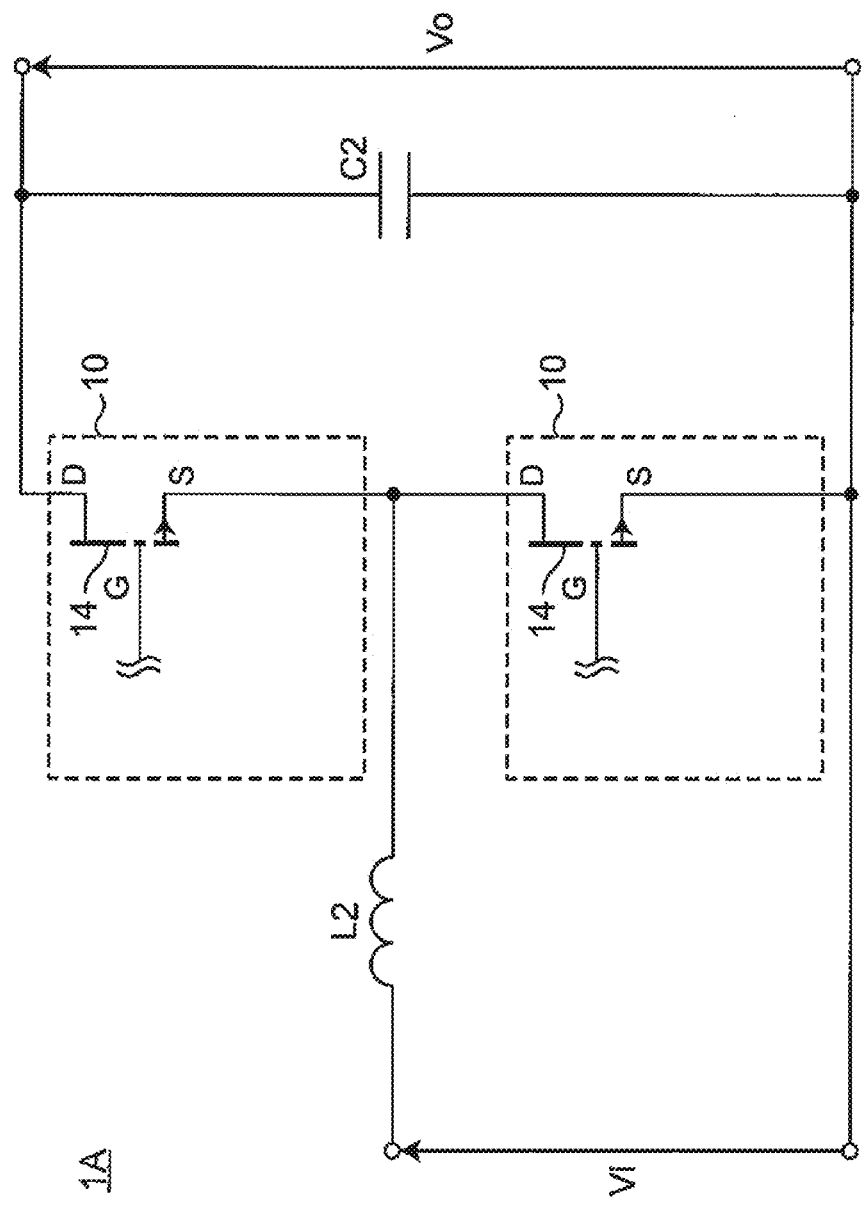
FIG. 11 is a block diagram showing a configuration example of a half-bridge inverter circuit 1A according to a variation 1.

For example, FIG. 11 is a block diagram showing a configuration example of the half-bridge inverter circuit 1A according to the variation 1. In FIG. 11, the half-bridge inverter circuit 1A includes an inductor L2, two current-driven switching circuits 10, and a capacitor C2.

In FIG. 11, the semiconductor switches 14 of the two current-driven switching circuits 10 are controlled so as to be turned on periodically and alternately. Thus, the input voltage Vi is switched, smoothed by the capacitor C2, and converted into the alternate-current output voltage Vo. Thus, the half-bridge inverter circuit 1A switches the direct-current input voltage Vi, converts it to the alternate-current output voltage Vo, and outputs it. The two current-driven switching circuits 10 may each be replaced with any one of the current-driven switching circuits 10A to 10E.

Figure 12:
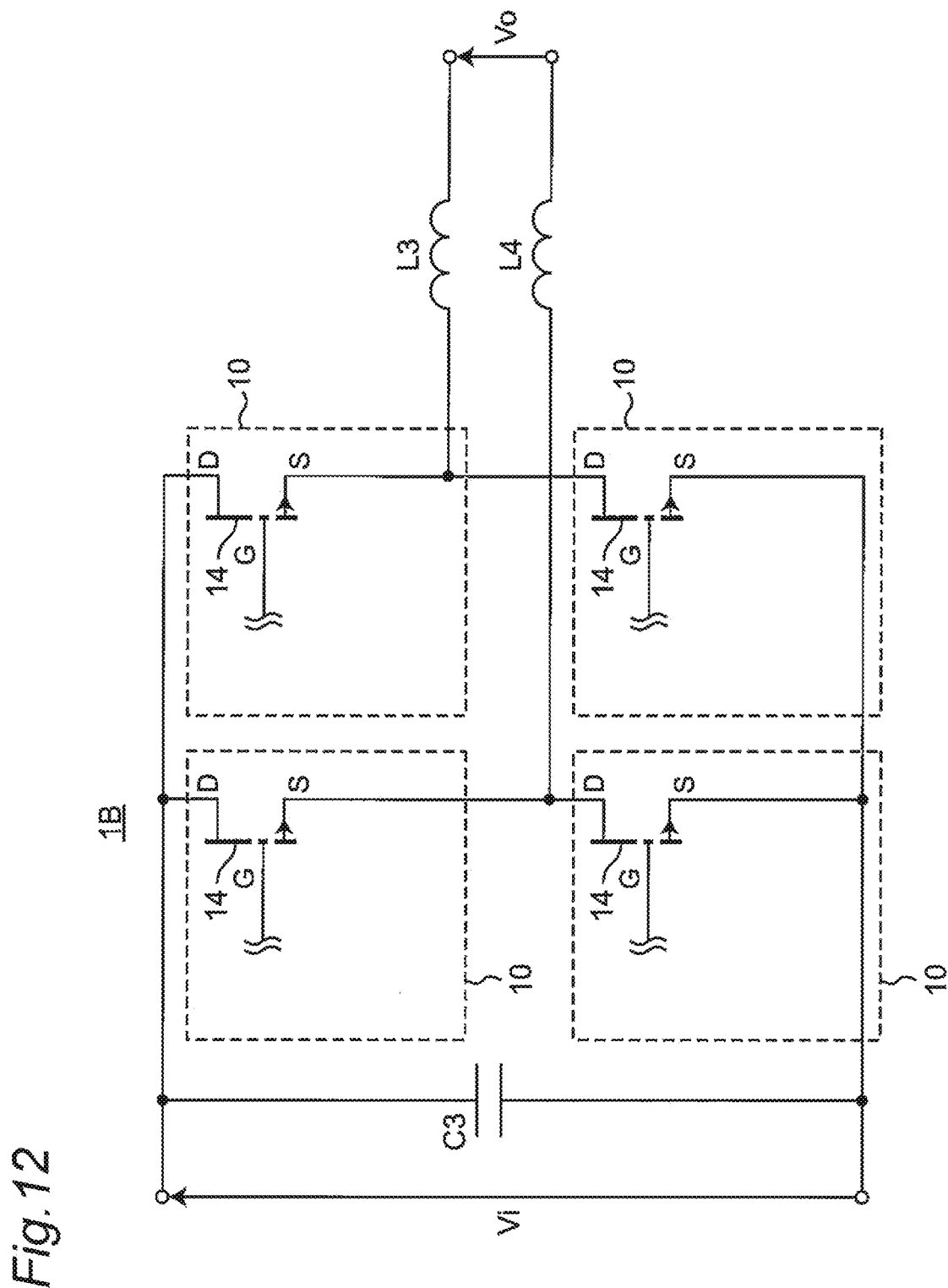
FIG. 12 is a block diagram showing a configuration example of a full-bridge inverter circuit 1B according to a variation 2.

FIG. 12 is a block diagram showing a configuration example of the full-bridge inverter circuit 1B according to the variation 2. In FIG. 12, the full-bridge inverter circuit 1B includes a capacitor C3, four current-driven switching circuits 10, and inductors L3 and L4.

In FIG. 12, the four current-driven switching circuits 10 are controlled so that a time interval in which the first and fourth current-driven switching circuits 10 (upper left and lower right of the figure) are turned on and the second and third current-driven switching circuits 10 (lower left and upper right of the figure) are turned off, and a time interval in which these on/off are switched appear periodically and alternately. Thus, the input voltage Vi is switched, and the switched input voltage Vi is smoothed by the capacitor C3 and the inductors L3 and L4. Thus, the full-bridge inverter circuit 1B switches the direct-current input voltage Vi, converts it to the alternate-current output voltage Vo, and outputs it. The four current-driven switching circuits 10 may each be replaced with any one of the current-driven switching circuits 10A to 10E.

Thus, the current-driven switching circuit and the overcurrent protection circuit according to the present invention can be used in a circuit and a device that control switching of current in a semiconductor device.

In the first to sixth embodiments, the pull-up resistor R2 is used as a means for limiting the current from the power supply of the threshold voltage VTH. However, the present invention is not limited thereto, and a diode or the like may be used instead of the pull-up resistor R2. Furthermore, in the first to sixth embodiments, the current-driven switching circuits 10 and 10A to 10E are used as switching circuits. However, the present invention is not limited thereto, and a voltage-driven switching circuit may be used instead of the current-driven switching circuit.

The invention claimed is:

1. An overcurrent protection circuit for a switching element turned on/off on a basis of a control voltage, the overcurrent protection circuit comprising:
a first transistor that is a PNP bipolar transistor and has an emitter connected to the control voltage;
a second transistor that is an NPN bipolar transistor and has a base connected to a collector of the first transistor, a collector connected to a base of the first transistor and pulled up to a predetermined pull-up voltage, and a grounded emitter; and
a time constant circuit connected in parallel to a collector and emitter of the second transistor, the time constant circuit including a resistor and a first capacitor, and adjusting a period of time from start to end of the protection operation by changing a time constant.

2. The overcurrent protection circuit according to claim 1, further comprising a diode connected in parallel to the resistor.

3. An overcurrent protection circuit for a switching element turned on/off on a basis of a control voltage, the overcurrent protection circuit comprising:
a first transistor that is a PNP bipolar transistor and has an emitter connected to the control voltage;
a second transistor that is an NPN bipolar transistor and has a base connected to a collector of the first transistor, a collector connected to a base of the first transistor and pulled up to a predetermined pull-up voltage, and a grounded emitter;
a first capacitor that is a capacitor connected to a collector and emitter of the second transistor, the first capacitor reducing a change in the pull-up voltage when the control voltage rises;

a control unit that generates the control voltage; and a voltage detector unit that detects the pull-up voltage, and outputs the detected voltage having been detected to the control unit as a first control signal for turning off the switching element, wherein when the control voltage exceeds a predetermined first threshold voltage, the first and second transistors are turned on, the control voltage is dropped by drop of the pull-up voltage, and thus the overcurrent protection circuit starts a protection operation of turning off the switching element, and the overcurrent protection circuit further comprises another switching element that turns the pull-up voltage from off to on, on a basis of a second control signal from the control unit when the overcurrent protection circuit restores from the protection operation.

\* \* \* \* \*